US005729161A

United States Patent [19]

Corsi

[11] Patent Number: 5,729,161

[45] Date of Patent: Mar. 17, 1998

[54] TEMPERATURE-COMPENSATED SUMMING COMPARATOR

[75] Inventor: Marco Corsi, Dallas, Tex.

[73] Assignee: Texas Instruments Incorporated, Dallas, Tex.

[21] Appl. No.: 698,601

[22] Filed: Aug. 16, 1996

Related U.S. Application Data

[60] Provisional application No. 60/002,530, Aug. 18, 1995.

[51] Int. Cl. 6 .............................. H03K 5/22; H01L 35/00

[52] U.S. Cl. .............................. 327/65; 327/83; 327/513; 327/361; 327/362

[58] Field of Search .............................. 327/65, 307, 83, 327/362, 361, 355, 334, 512, 513; 330/256

[56] References Cited

U.S. PATENT DOCUMENTS

| | | | |
|---|---|---|---|
| 4,495,429 | 1/1985 | Oda et al. | 327/513 |
| 5,122,760 | 6/1992 | Nishijima | 330/256 |
| 5,648,741 | 7/1997 | Wichern | 327/513 |

*Primary Examiner*—Toan Tran

*Attorney, Agent, or Firm*—W. James Brady, III; Richard L. Donaldson

[57] ABSTRACT

In a summing comparator (10) in which one differential input voltage received by one differential pair (18) is dependent on temperature variations, such as across a resistor (12) with a large temperature coefficient, the dependence on temperature is offset by introducing cancelling temperature dependence in the other differential pairs (14, 16).

10 Claims, 1 Drawing Sheet

TEMPERATURE-COMPENSATED SUMMING COMPARATOR

This application claims priority under 35 USC § 119(e) (1) of provisional application No. 60/002,530 filed Aug. 18, 1995.

TECHNICAL FIELD OF THE INVENTION

This invention is related in general to electronic circuits. More particularly, the invention is related to a temperature-compensated summing comparator.

BACKGROUND OF THE INVENTION

A summary comparator receives a number of differential input voltages, and generates an output having a logic high if the sum of the differential input voltages is greater than zero or a logic low if the sum is less than zero. The summing comparator is a building block commonly used to construct circuits such as a direct summing DC/DC converter. In certain instances, one or more differential input may require temperature compensation because the varying temperature coefficients present at the inputs. In an integrated circuit, one set of the differential inputs of the comparator may be connected across a metal interconnect used to implement a resistor to sense current in a current-mode direct summing DC/DC converter. The temperature coefficient of such a resistor may be in the range of 3400 ppm° $C.^{-1}$. However, the other differential inputs to the summing comparator may not have similar temperature coefficient characteristics and may lead to incorrect results. Typically, such inputs have little or no temperature coefficient.

SUMMARY OF THE INVENTION

Accordingly, there is a need for a summing comparator with one or more temperature-compensated differential input.

In accordance with the present invention, a summing comparator is provided which eliminates or substantially reduces the disadvantages associated with prior circuits.

In one aspect of the invention, the summing comparator includes at least one first differential pair each receiving a differential voltage input independent of temperature, and at least one second differential pair each receiving a differential voltage input dependent of temperature. At least one first current source is coupled to the at least one first differential pair to generate a temperature-dependent current for driving the at least one first differential pair and off-setting the effects of said differential voltage input dependent of temperature.

In another aspect of the invention, the summing comparator includes at least one first current source, which generates a current having the form:

$$I = \frac{kT}{q} \ln x,$$

where I is the current generated, q is the magnitude of the electron charge, k is the Boltzmann constant, T is the temperature in °K, and x is a constant.

In yet another aspect of the invention, the summing comparator generates a high output if $$V_{id1}G + V_{id2}G + \ldots + V_{idn}\frac{qI_n}{kT} > 0,$$

and generates a low output if $$V_{id1}G + V_{id2}G + \ldots + V_{idn}\frac{qI_n}{kT} < 0,$$

where $V_{id1}$, $V_{id2}$, . . . $V_{id(n-1)}$ are differential voltage inputs to the at least one first differential pair, and $V_{idn}$ is a differential voltage input to the at least one second differential pair, G is a constant, $I_n$ is the current generated by the at least one second current source, q is the magnitude of the electron charge, k is the Boltzmann constant, and T is the temperature in °K.

A technical advantage of the present invention is the implementation of a summing comparator circuit which provides accurate outputs even when one of its input is temperature-varying.

BRIEF DESCRIPTION OF THE DRAWINGS

For a better understanding of the present invention, reference may be made to the accompanying drawings, in which.

DETAILED DESCRIPTION OF THE INVENTION

Figure 1:
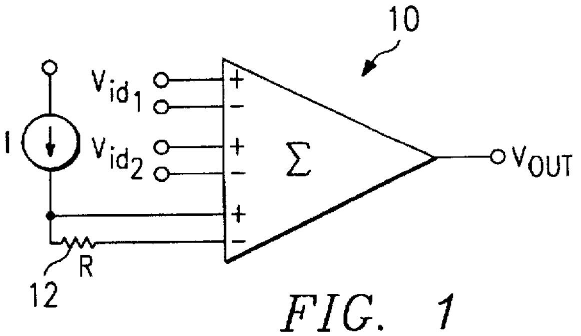
FIG. 1 is a simple block diagram of a summing comparator.

Referring to FIG. 1, the summing comparator 10 is shown having three sets of differential inputs identified as $V_{id1}$, $V_{id2}$ and $V_{id3}$, where $V_{id3}$ is the voltage drop across a metal element or component 12. The output, $V_{OUT}$, is a logic high if $$V_{id1}+V_2+V_{id3}>0,$$

and the output $V_{OUT}$ is a logic low if $$V_{id1}+V_2+V_{id3}<0.$$

In instances where one set of the differential inputs is connected across metal component 12 such as an aluminum resistor R, its large temperature coefficient requires temperature compensation even though the current I flowing through the resistor is temperature-independent. In that instance, the voltage across the resistor R is:

$$V_{id3}=I(T_{ROOM}+T_c*\Delta T)$$

where $T_{ROOM}$ is room temperature, ΔT is the difference in temperature from room temperature, and $T_c$ is the temperature coefficient of the resistor. For an aluminum resistor, $T_c$ is approximately 3400 ppm° $C.^{-1}$. Therefore, the effects of $T_c$ of the resistor needs to be offset for the logic equation of the summing comparator 10 to still hold true.

Figure 2:
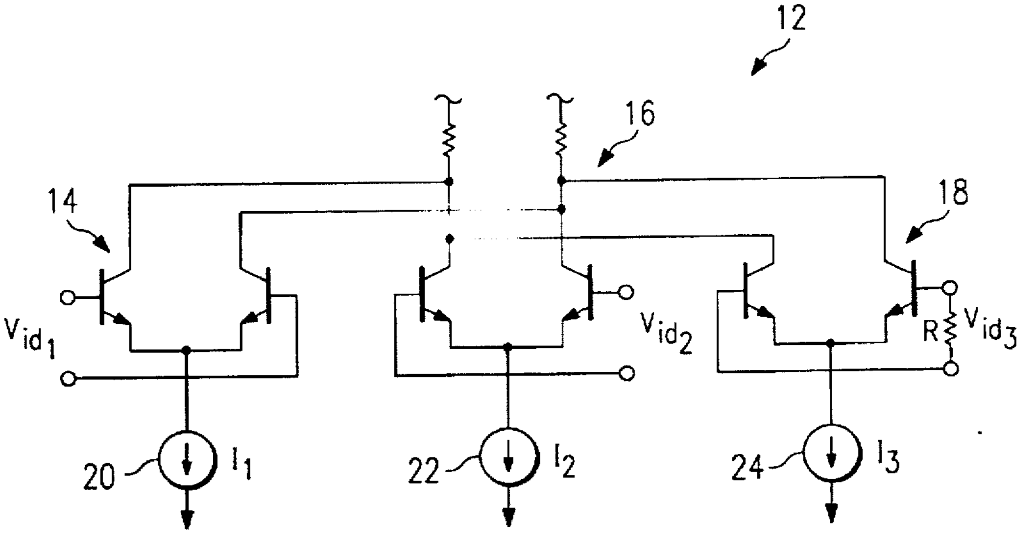
FIG. 2 is a simplified schematic diagram of the differential inputs of the summing comparator constructed according to the teachings of the present invention.

FIG. 2 shows an implementation of the input stage 12 of the summing comparator 10 constructed according to the teachings of the invention. The input stage 12 includes three differential pairs 14–18 for receiving three differential voltage inputs, $V_{id1}$, $V_{id2}$ and $V_{id3}$. The differential pairs 14–18 are constructed of matched bipolar transistors with their emitters connected together and biased by respective currents. The differential pair 14 is biased by a current source 20 having a current of $I_1$, the differential pair 16 is biased by a current source 22 having a current of $I_2$. Current sources 20 and 22 generate currents, $I_1$ and $I_2$ respectively, that are proportional to absolute temperature conforming to the general equation:

$$I_1 = I_2 = \frac{kT}{q} \ln x,$$

where q is the magnitude of the electron charge, k is the Boltzmann constant, T is the temperature in °K, and x represents the ratio of transistor sizes in the current source 20 or 22. The differential pair 18 driving the input stage with the temperaturing varying differential voltage, on the other hand, is constructed to generate a constant current source 24 having the temperature-independent current, $I_3$. The three pairs of transistors further have their collectors connected to one another, which are then coupled to a positive supply voltage through some resistance. Note that the instant invention may be extended to summing comparators having more than three differential inputs.

Figure 3:
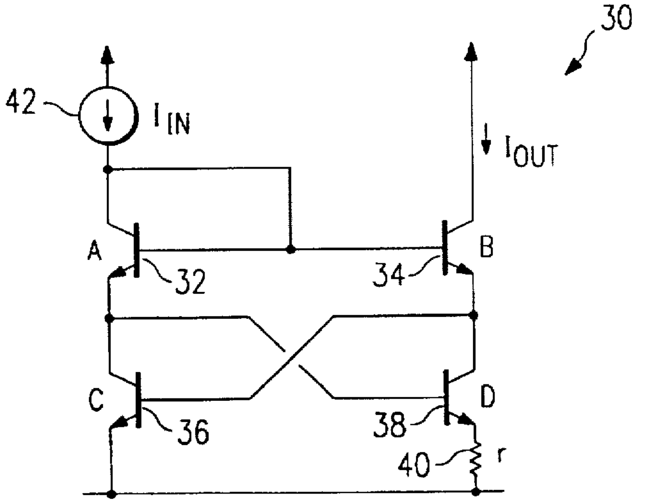
FIG. 3 is a circuit schematic diagram of an exemplary current source generating a temperature-dependent current.

The construction of current sources which are temperature-dependent and temperature-independent is known in the art. However, FIG. 3 shows an exemplary current source 30 generating a current, $I_{OUT}$. The current source 30 includes two bipolar transistors 32 and 34 with the bases coupled together, and transistor 32 connected as a diode by shorting its collector to its base. A third transistor 36 has a collector that is coupled to the emitter of transistor 32, and its base coupled to the emitter of transistor 34. A fourth transistor 38 has its base coupled to the emitter of transistor 32 and its collector coupled to the emitter of transistor 34. A resistor 40 is further coupled to the emitter of transistor 38. A bias current 42, $I_{IN}$, flows into the collector of transistor 32. The current source 30 generates a current, $I_{OUT}$, that is dependent on temperature:

$$I_{OUT} = \frac{kT}{qR} \ln\left(\frac{AD}{BC}\right),$$

where A, B, C, D are the areas of the transistors 32–38, respectively, and R is the resistance value of the resistor 40. The current, $I_{OUT}$, are then used to drive differential pairs 14 and 16.

Constructed in this manner, the current sources 20 and 22 may be constructed to generate $I_1$ and $I_2$ that are proportional to absolute temperature. The transconductance, $g_{m1}$, for the differential pair 14, is thus equal to the transconductance, $g_{m2}$, of the second differential pair 16. The temperature coefficient of $I_{OUT}$ is such that the transconductance of differential pairs 14 and 16 is independent of temperature, i.e., $$g_{m1} = g_{m2} = G.$$

The current $I_3$ is independent of absolute temperature and hence the transconductance of differential pair 18 is $$g_{m3} = \frac{qI_3}{kT}$$

The balance point of the input stage 12 is given by:

$$V_{id1}g_{m1} + V_{id2}g_{m2} + V_{id3}g_{m3} = 0$$

or $$V_{id1}G + V_{id2}G + V_{id3}\frac{qI_3}{kT} = 0.$$

Since the temperature coefficient of $$V_{id3}\frac{qI_3}{kT}$$

approximately −3300 ppm°C.$^{-1}$, then it can be said:

$$V_{id1}G + V_{id2}G + IR_{ROOM\ TEMP} = 0$$

is now the balance condition as the temperature of the third term compensates for the temperature coefficient of the aluminum resistor.

It may be appreciated that the present invention is equally applicable to transistors other than n-p-n bipolar transistors and is further applicable to circuit applications using differential inputs. Further, it is well known in the art the methods of generating current sources which are proportional to absolute temperature or current sources which are independent of temperature. The instant invention is applicable to summing comparators having two or more differential voltage inputs.

Although the present invention and its advantages have been described in detail, it should be understood that various changes, substitutions and alterations can be made therein without departing from the spirit and scope of the invention as defined by the appended claims.

What is claimed is:

1. A summing comparator, comprising:

a summing comparator output;

at least one first differential pair each receiving a differential voltage input and having an output coupled to the summing comparator output;

a second differential pair receiving a differential voltage input dependent of temperature and having an output coupled to the summing comparator output;

at least one first current source coupled to said at least one first differential pair, said at least one first current source generating temperature-dependent current for driving said at least one first differential pair; and a second current source coupled to said second differential pair, said second current source generating temperature-independent current for driving said second differential pair.

2. The summing comparator, as set forth in claim 1, wherein said at least one first current source generates a current having the form:

$$I = \frac{kT}{q} \ln x,$$

where I is the current generated, q is the magnitude of the electron charge, k is the Boltzmann constant, T is the temperature in °K, and x is a constant.

3. The summing comparator, as set forth in claim 1, generating a high output at the summing comparator output if $$V_{id1}G + V_{id2}G + \ldots + V_{idn}qI_n/kT > 0,$$

and generating a low output at the summing comparator output if $$V_{id1}G + V_{id2}G + \ldots + V_{idn}qI_n/kT < 0,$$

where $V_{id1}$, $V_{id2}$, . . . and $V_{id(n-1)}$ are differential voltage inputs to said at least one first differential pair, and $V_{idn}$ is a differential voltage input to said second differential pair, G is a constant, $I_n$ is the current generated by said second current source, q is the magnitude of the electron charge, k is the Boltzmann constant, and T Is the temperature in °K.

4. The summing comparator, as set forth in claim 1, wherein said second differential pair receives a differential voltage input across a circuit element having a large temperature coefficient.

5. The summing comparator, as set forth in claim 1, wherein said second differential pair receives a differential voltage input across a resistor having a large temperature coefficient.

6. A circuit, comprising:

a circuit output;

at least one first differential pair each receiving a differential voltage input and having an output coupled to the circuit output;

a second differential pair receiving a differential voltage input dependent of temperature and having an output coupled to the circuit output;

at least one first current source coupled to said at least one first differential pair, said at least one first current source generating temperature-dependent current for driving said at least one first differential pair; and a second current source coupled to said second differential pair, said second current source generating temperature-independent current for driving said second differential pair.

7. The circuit, as set forth in claim 6, wherein said at least one first current source generates a current having the form:

$$I = \frac{kT}{q} \ln x,$$

where I is the current generated, q is the magnitude of the electron charge, k is the Boltzmann constant, T is the temperature in °K, and x is a constant.

8. The circuit, as set forth in claim 6, generating a high output at the circuit output if $$V_{id1}G+V_{id2}G+ \ldots +V_{idn}qI_n/kT>O,$$

and generating a low output at the circuit output if $$V_{id1}G+V_{id2}G+ \ldots +V_{idn}qI_n/kT<O,$$

where $V_{id1}$, $V_{id2}$, . . . and $V_{id(n-1)}$ are differential voltage inputs to said at least one first differential pair, and $V_{idn}$ is a differential voltage input to said second differential pair, G is a constant, $I_n$ is the current generated by said second current source, q is the magnitude of the electron charge, k is the Boltzmann constant, and T is the temperature in °K.

9. The circuit, as set forth in claim 6, wherein said second differential pair receives a differential voltage input across a circuit element having a large temperature coefficient.

10. The circuit, as set forth in claim 6, wherein said second differential pair receives a differential voltage input across a resistor having a large temperature coefficient.

* * * * *